(12) United States Patent
Street

(10) Patent No.: US 6,952,014 B1
(45) Date of Patent: Oct. 4, 2005

(54) END-POINT DETECTION FOR FIB CIRCUIT MODIFICATION

(75) Inventor: Alan Glen Street, San Diego, CA (US)

(73) Assignee: Qualcomm Inc, San Diego, CA (US)

( * ) Notice: Subject to any disclaimer, the term of this patent is extended or adjusted under 35 U.S.C. 154(b) by 15 days.

(21) Appl. No.: 10/865,056

(22) Filed: Jun. 9, 2004

Related U.S. Application Data

(60) Provisional application No. 60/560,134, filed on Apr. 6, 2004.

(51) Int. Cl.[7] .................. H01J 37/304; H01L 21/306
(52) U.S. Cl. .................. 250/309; 250/306; 250/307; 250/492.21; 250/492.22; 216/58; 216/59; 216/61; 216/62; 216/66; 216/83; 216/84; 216/86; 216/87; 216/94; 204/192.33; 204/192.34
(58) Field of Search ................ 250/306, 307, 250/309, 492.21, 492.22; 216/58, 59, 61, 216/62, 66, 83, 84, 86, 87, 94; 204/192.33, 204/102.34, 192.34

(56) References Cited

U.S. PATENT DOCUMENTS

| | | | | |
|---|---|---|---|---|
| 5,140,164 | A * | 8/1992 | Talbot et al. | 250/492.2 |
| 5,952,658 | A * | 9/1999 | Shimase et al. | 250/309 |
| 6,031,229 | A * | 2/2000 | Keckley et al. | 250/309 |
| 6,210,981 | B1 * | 4/2001 | Birdsley et al. | 438/9 |
| 6,549,022 | B1 * | 4/2003 | Cole et al. | 324/752 |
| 6,617,862 | B1 * | 9/2003 | Bruce | 324/752 |
| 6,649,919 | B2 * | 11/2003 | Chao et al. | 250/492.2 |
| 6,843,927 | B2 * | 1/2005 | Naser-Ghodsi | 216/84 |
| 2002/0066863 | A1 * | 6/2002 | Chao et al. | 250/397 |
| 2002/0074494 | A1 * | 6/2002 | Lundquist et al. | 250/307 |
| 2003/0132196 | A1 * | 7/2003 | Lundquist et al. | 216/66 |

OTHER PUBLICATIONS

Cole, Edward., *Rapid Localization of IC Open Conductors Using Charge-Induced Voltage Alteration* (CIVA). CH3084-1/92/0000-028801.00 (IEEE/IRPS).

* cited by examiner

Primary Examiner—John R. Lee
Assistant Examiner—Bernard E. Souw
(74) Attorney, Agent, or Firm—Philip R Wadsworth; Charles D Brown; George C Pappas

(57) ABSTRACT

A Focused Ion Beam (FIB) milling end-point detection system uses a constant current power supply to energize an Integrated Circuit (IC) that is to be modified. The FIB is cycled over a conductive trace that is to be accessed during the milling process. The input power, or voltage to the IC is monitored during the milling process. The end-point can be detected when the FIB reaches the conductive trace. The FIB can inject charge onto the conductive trace when the FIB reaches the level of the conductive trace. An active device coupled to the conductive trace can amplify the charge injected by the FIB. The active device can operate as a current amplifier. The change in IC current can result in an amplified change in device input voltage. The end-point can be detected by monitoring the change in input voltage from the constant current power supply.

26 Claims, 5 Drawing Sheets

END-POINT DETECTION FOR FIB CIRCUIT MODIFICATION

This application claims the benefit of provisional U.S. Application Ser. No. 60/560,134, entitled "End-Point Detection For FIB Circuit Modification," filed Apr. 6, 2004.

BACKGROUND OF THE DISCLOSURE

Focused Ion Beam (FIB) milling can be used during the course of Integrated Circuit (IC) development to modify circuits embodied within one or more layers of a semiconductor device. The FIB can be used to physically alter traces within the IC. In a FIB IC modification, very small holes, also referred to as vias, can be milled into the IC in order to expose conductive layers or traces that are buried under the surface of the IC. The depth of the vias may only be on the order of microns. Thus, knowing when the FIB milling process has reached the conductive layers or traces can be critical to the success of the modification. Undermilling, or completing a via before the conductive layer or trace is reached can result in a poor electrical connection. Additionally, overmilling, or continuing to mill after the conductive layer or trace has been reached, can destroy the conductor and defeat the intended modification.

Because of the precision required of the FIB milling process, various end-point detection methods are employed. One method employs visual feedback. The FIB milling process is periodically stopped and an operator views the milled hole to see if the conductive layer or trace has been reached. Typically, the operator uses some type of focused ion beam or scanning electron microscopy to view the end-point because of the small dimensions of the hole.

For low aspect ratio holes or relatively large diameter holes, where the depth of the hole is less than three times the diameter of the hole or the hole diameter is greater than approximately 0.75 microns, visual inspection may be an acceptable end-point detection method. However, visual inspection does not perform acceptably for high aspect ratio holes. In very high aspect ratio vias, where the depth of the hole is greater than or equal to approximately ten times the diameter of the hole, the depth of the hole may not allow an operator to see the bottom of the hole, or there may be insufficient contrast at the bottom of the hole for the operator to determine if the desired layer has been reached.

An alternative end-point detection method uses a FIB whose milling parameters are correlated to milling time or total ion dose. In such an end-point detection system, a FIB with a given beam current is used to mill various holes in a test IC. The depth of the holes are correlated against the time of milling or total ion dose to generate a characteristic curve. Curves can be generated for other beam currents, and curves can also be generated for different IC types, different process generations, and different IC foundries. A milling time needed to achieve a desired hole depth can then be approximated by examining the closest characteristic curve.

The numerous characteristic curves do not ensure accurate milling of a desired device because milling by time and current assumes a consistent milling process across multiple devices. The level of uniformity among devices may not always be sufficient to predict a milling depth based on characteristic curves. Drift in the device manufacturing process or in the FIB system can require complete re-characterization of the milling process.

BRIEF SUMMARY OF THE DISCLOSURE

A Focused Ion Beam (FIB) milling end-point detection system using a constant current power supply to energize an Integrated Circuit (IC) that is to be modified is disclosed. The FIB is cycled over a conductive trace that is to be accessed during the milling process. The input voltage to the IC can be monitored during the milling process and the end-point determined based in part on the voltage.

In one aspect, the disclosure includes a method of detecting an end-point using a FIB. The method includes energizing a device with a constant current power supply, removing material from the device over at least a portion of a conductor using the FIB, monitoring a supply voltage of the device, and determining that the end-point is reached based in part on the supply voltage.

In another aspect, the disclosure includes a method of detecting an end-point using a FIB. The method includes energizing a device with a constant current power supply until a power supply voltage is within a predetermined percentage of a nominal operating voltage, milling a portion of the device that overlaps at least a portion of a conductive trace using a cycled FIB, monitoring an AC component of the power supply voltage, determining that the end-point is reached when the AC component is greater than or equal to a predetermined value, and halting milling after determining the end-point is reached.

In still another aspect, the disclosure includes a method of detecting an end-point using a FIB. The method includes milling a device with the FIB to remove material over at least a portion of a conductive trace, injecting current onto the conductive trace with the FIB, amplifying the current with the device to produce an end-point detection signal, and determining that the end-point is reached when the end-point detection signal exceeds a predetermined threshold.

In still another aspect, the disclosure includes a method of detecting an end-point using a FIB. The method includes injecting a current onto a conductive trace within a device with a cycled FIB, amplifying the current using an electronic circuit within the device to produce an amplified signal, and determining that the end-point is reached based at least in part on the amplified signal.

In still another aspect, the disclosure includes an end-point detection system. The system includes a FIB configured to remove material from a device over a portion of a conductive trace, a constant current power supply configured to provide a bias current to the device, an amplifier configured to amplify at least a component of a device power supply voltage to produce an amplified signal, and a control module configured to process the amplified signal and provide an indication of an FIB position, the control module configured to indicate that the end-point is reached based in part on the amplified signal.

In still another aspect, the disclosure includes an end-point detection system. The system includes means for energizing a device, means for removing material from the device over at least a portion of a conductor within the device, means for monitoring a supply voltage of the device, and means for determining that the end-point is reached based in part on the supply voltage.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE DISCLOSURE

A system and method of end-point detection in a FIB milling system is disclosed. The system and method can use a constant current power supply to energize a device to be modified. The signal pins, or non-power supply pins, of the device to be modified can be all grounded, all floating, all pulled high, or can be configured to a predetermined state including a combination of grounded, pulled high, and floating connections. The FIB can be positioned over the device to be modified over the location of the desired trace or electrical connection. The FIB beam current can then be applied to begin milling the device to be modified.

The FIB can be cycled by cycling the beam current or by physical cycling. Cycling the beam current can generate a FIB with a duty cycle corresponding to the duty cycle used to cycle the beam current. Physical cycling can be achieved by physically repositioning the FIB such that the beam is positioned over the desired conductor for a portion of the milling time. In physical cycling, the FIB can remain energized, but the beam may only be positioned over the desired conductor for a percentage of the milling time.

The FIB can reach the desired conductor after removing upper layers in the device. When the FIB reaches the desired conductor, the FIB can act as a charge pump or current source that contributes signal energy to the electronic circuit within the device that is associated with or otherwise common with the desired conductor. The associated electronic circuit can, depending on the configuration of the device, operate as an amplifier and amplify the FIB current.

When the device amplifies the FIB current, a corresponding change in supply current can produce a change in an input power supply voltage. The variation in the power supply voltage can operate as an amplified FIB output signal. If the FIB is cycled, the device power supply voltage can be a DC signal having superimposed an AC signal with a duty cycle corresponding to the FIB duty cycle.

An AC coupled amplifier, external to the device, can be configured to monitor the power supply voltage applied to the device. The amplifier can further amplify the AC component of the power supply voltage. The amplified AC component can then be used to determine when to cease FIB milling. The amplified component can be, for example compared to a threshold value and can terminate FIB milling once the signal exceeds the threshold value.

Figure 1:
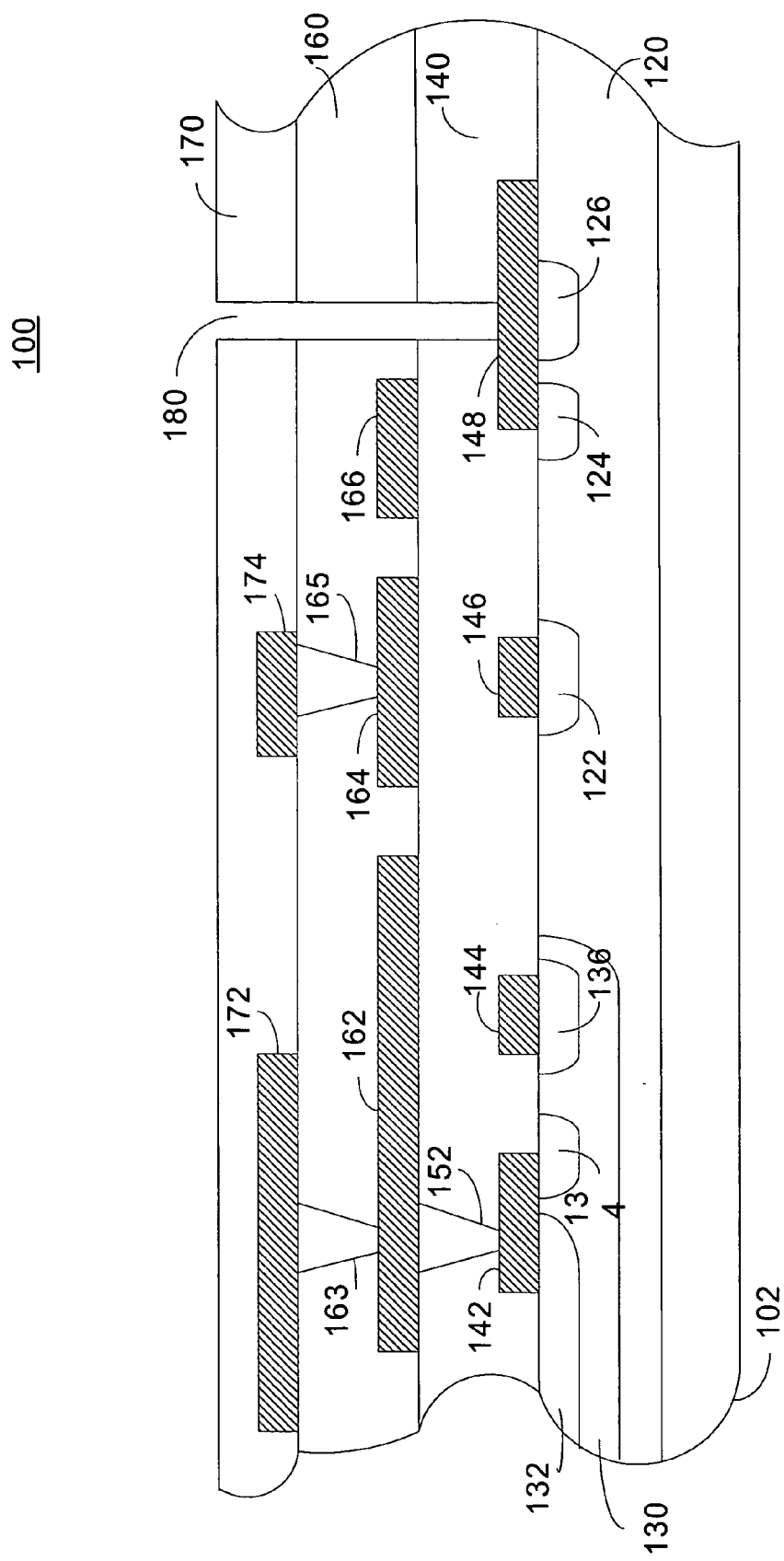
FIG. 1 is a cross sectional view of a device illustrating a via milled to a conductor on a conductive layer.

FIG. 1 is a cross section view of a device 100 illustrating a via 180 milled to a conductor 148 on a conductive layer using a system or method of the disclosure. The structure of the device 100 is provided only as an example of possible device 100 structures that can be milled using the disclosed systems and methods. The FIB end-point detection systems and methods are generally applicable to any device 100 type or structure.

In the example of FIG. 1, the device 100 is constructed on a substrate 102, that can be, for example, an n-type semiconductor substrate. An n-type layer 120 can be built on top of the substrate 102, or may be manufactured from a portion of the substrate 102.

Numerous doped wells or implants can be positioned within the n-type layer 120 depending on the type of structure manufactured. In the example shown in FIG. 1, a p-type well 130 includes a p+ region 136 as well as two n+ regions 132 and 134. Additionally, two p+ regions 124 and 126 and an n+ region 122 are included within the n-type layer 120.

A layer having conductors is deposited above the n-type layer 120. The first layer of conductors can be referred to as a Metal-1 layer, although the conductors are not limited to metal conductors, but can include other conductive materials. In the Metal-1 layer, the cross section of four conductors 142, 144, 146, and 148 can be seen. The conductors 142, 144, 146, and 148 are covered with an insulating layer 140.

A second conductor layer, which may be referred to as a Metal-2 layer, can be built on the insulator layer 140. The Metal-2 layer can include, for example, three conductors 162, 164, and 166 covered by a second insulating layer 160. A via 152 can extend from a first conductor 162 on the Metal-2 layer to a conductor 142 on the Metal-1 layer.

Similarly, a third conductor layer, which may be referred to as a Metal-3 layer, can include two conductors 172 and 174 that may be covered by a third insulating layer 170. Through layer vias 163 and 165 can extend from conductors 172 and 174 on Metal-3 to conductors 162 and 164 on Metal-2. Typically, the vias 152, 163, and 165 are conductive vias that are used to route signals or power from one metal layer to another.

The device 100 can be modified by the disclosed FIB milling system and process to produce, for example, a via 180 to a conductor 148 on the Metal-1 layer. The via 180 can then be metallized to form, for example, an electrical contact that can be probed during testing of the device 100. Alternatively, the via 180 can be metallized to form a part of a jumper manufactured between conductors.

The disclosed end-point detection system and method allows the FIB milling process to be halted as the FIB reaches the conductor 148. The presence of a good electrical contact with the conductor 148 can trigger the end-point detection system to halt the FIB milling process.

Figure 2:
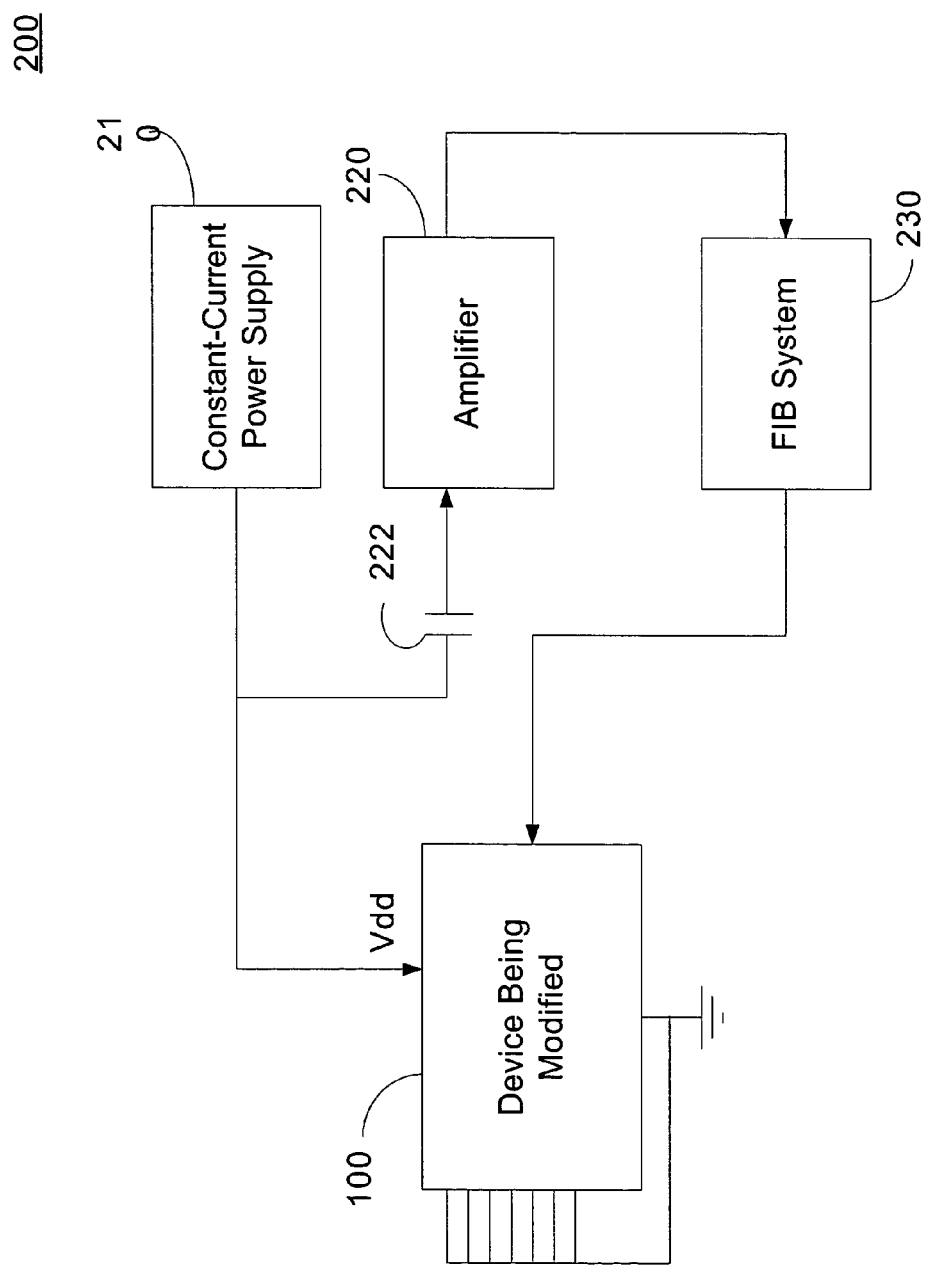
FIG. 2 is a functional block diagram of an end-point detection system.

FIG. 2 is a functional block diagram of an end-point detection system 200. The system 200 can detect a FIB applied to a conductive trace on a device 100, which can be the device 100 of FIG. 1. The device 100 may be any type of device, such as a processor, Application Specific Integrated Circuit (ASIC), Field Programmable Gate Array (FPGA), integrated circuit (IC), RF device, and the like, or some other electronic device. The conductive trace can be, for example, metal, polysilicon, and the like or some other structure for conducting charge.

The end-point detection system 200 can include a constant current power supply 210, and a signal amplifier 220 coupled to an output of the constant current power supply 210. As shown in the embodiment of FIG. 2, a capacitor 222 can be used to couple the output of the constant current power supply 210 to the input of the signal amplifier 220.

The system 200 can also include a FIB system 230. The FIB system 230 can include a FIB that can be coupled to a device being modified 100. Additionally, the FIB system 230 can include a control input that is configured to receive an input signal that halts the FIB milling process. In the embodiment of FIG. 2, the output of the signal amplifier 220 can be coupled to the control input of the FIB system 230.

The end-point detection system 200 of FIG. 2 can operate by initially configuring the device to be modified 100. Configuring the device to be modified 100 can include configuring a device state as well as determining a bias current value for the device 100.

In the embodiment shown in FIG. 2 the device 100 is configured by grounding all non-power supply inputs to the device 100. However, other device 100 configurations are possible. For example, all of the device 100 non-power supply pins may be allowed to float. In another embodiment, all device 100 non-power supply pins may be pulled high. In still another embodiment, the various device 100 input and output pins may be configured to a predetermined state, where some pins are pulled low, some pins are pulled high, and other pins are allowed to float. In yet another embodiment, the device 100 can be configured to be in a state used for device 100 burn-in or $I_{DDQ}$ testing.

After configuring the device 100, a bias current for the device 100 can be determined. The device 100 bias current can be determined by a variety of methods. In one embodiment, the configured device 100 is energized with a constant voltage power supply set to the nominal device operating voltage. Then the steady state current of the device can be measured. The device 100 bias current can then be based on the steady state current of the device 100 when energized with a constant voltage power supply. For example, the bias current may be set to a percentage of the steady state current. The percentage can be, for example 80%, 90%, 95%, 100%, 105%, 110%, or some other percentage of the steady state current.

In another embodiment, the device 100 bias current is determined by monitoring the device 100 supply voltage while varying the supply current from a constant current power supply. After configuring the device, 100 the supply current to the device 100 provided by a constant current power supply can be increased until the supply voltage reaches a predetermined value. The predetermined voltage value can be a function of the nominal operating voltage. For example, the predetermined voltage can be a percentage of the nominal operating voltage, such as 80%, 90%, 95%, 100%, 105%, 110%, 120% or some other percentage of the nominal device operating voltage. The current at which the supply voltage reaches the predetermined voltage value represents the desired device 100 bias current.

After determining the device 100 bias current, the FIB modification may begin. The device 100 is energized using a constant current power supply 210 configured to provide the bias current to the device 100. The input of a signal amplifier 220 is coupled to the output of the constant current power supply 210 to monitor the voltage at the power supply input of the device 100. A capacitor 222 can be used to AC couple the power supply 210 output to the signal amplifier 220 input to reduce any power supply 210 loading due to the input impedance of the signal amplifier 220. Additionally, the coupling capacitor 222 can be used to eliminate the DC level of the power supply 210 in configurations that monitor solely AC signals. Alternatively, the signal amplifier 220 may have an AC coupled input and may be coupled to the power supply 210 output directly without the need for a DC blocking capacitor 222.

The output of the signal amplifier 220 can be coupled to an input of the FIB system 230. In one embodiment, the input is a detector input that is configured to halt the FIB milling process when the input signal reaches a predetermined value. The predetermined value may be, for example, a predetermined input RMS signal value.

In another embodiment, the output of the signal amplifier 220 is coupled to a detection module that is coupled to one or more indicators. An indicator may alert an operator that the desired FIB milling end point is reached when the output of the signal amplifier 220 reaches a predetermined value. The predetermined value may be, for example, a predetermined RMS signal value. The indicators can include, for example, lights, meters, audible alerts, and the like, or some other device for indicating an alert. In response to the alert, the operator may halt the FIB milling process.

The FIB system 230 can also include a FIB that is used to modify the device 100. The FIB can be positioned over the device 100 to be modified. In particular, the FIB can be positioned over the portion of the conductor or trace to be exposed by the milling process. The device 100 can be energized with the bias current from the constant current power supply 210 and the FIB beam current can be energized.

The FIB can be cycled such that the energy from the FIB incident on the conductor or trace is cycled when the FIB reaches the trace. The FIB can be cycled by cycling the FIB energy or by physically cycling the FIB over the conductor or trace. In one embodiment, the FIB is cycled by cycling the FIB energy. The FIB energy can be cycled, for example, by cycling the beam current on and off. The FIB energy can be cycled using some other method that cycles the FIB on and off. In another embodiment, the FIB energy is physically cycled by momentarily obscuring the FIB, such that the FIB is not incident on the device 100.

In still another embodiment, the FIB is scanned over a path that only impinges on the conductor or trace for a portion of the scanned path. Typically, because the diameter of the FIB is much smaller than the area to be milled, the FIB is scanned or rastered over a desired milling area. The FIB scanning or rastering pattern can be configured to overlap the conductor or trace for a portion of the pattern. Then, when the FIB reaches the depth of the conductor or trace, the FIB energy is incident on the conductor or trace only for the portion of the scan that overlaps the conductor.

In yet another embodiment, the FIB is sequentially scanned over multiple areas, some of which lie over the conductor or trace. For example, the FIB can be configured to scan over four distinct areas. A first area can be over the desired conductor or trace. Each of the three other areas can be over areas that are distinct from the conductor or trace. The FIB can then scan over the areas using a predetermined sequence. For example, in the four area embodiment, the scanning sequence may repeat the pattern 1-2-1-3-1-4, where 1 represents the area over the conductor and 2, 3, and 4 represent the areas distinct from the conductor. When the FIB mills down to the level of the conductor in area 1, the FIB will have only removed ⅓ the material in each of areas 2, 3, and 4. The FIB exhibits a 50% duty cycle over the conductor. Other embodiments may use other physical cycling methods.

Material can be removed from the device 100 during the time that the FIB is energized. The FIB can inject charge or energy into the device 100 when the FIB reaches the conductor or trace. The FIB can act as a charge pump, and can inject charge onto the conductor or trace once the material above the conductor is removed.

In one embodiment, the return, ground, or stage current of the device 100 can be measured and monitored for the change in current due to the addition of the FIB energy. However, the FIB beam current can be 10 pA or may even be as low as 1 pA in a FIB system 230. The FIB system 230 having a 1 pA beam current can be used, for example, to mill very high aspect ratio holes in devices 100 having trace widths less than 90 nm, 65 nm, 40 nm or smaller. It is difficult to measure such a small change in current or amplify such a small change in current. At such small current levels, the noise in the instrumentation system may be on the same order of magnitude as the signal being detected.

In another embodiment, internal circuits within the device 100 being modified can be used to amplify the FIB charge injected on the conductive trace. As discussed earlier, charge can be injected on to the conductor when the ion beam contacts the conductor. The additional charge can alter the current requirements of the device 100. Because the device 100 is energized with a constant current power supply 210, the change in device 100 current results in a change in the supply voltage. The signal amplifier 220 amplifies the change in voltage and the output of the signal amplifier 220 can be coupled to the FIB system 230 to halt the FIB milling process. It can be advantageous to cycle to the FIB such that the charge injected onto the conductor is cycled. When the charge injected to the conductor is cycled, the device 100 current can vary between the steady state condition and a transient condition that may occur due to the charge injection. The device 100 supply voltage can correspondingly change based on the FIB cycle. Thus, end-point detection is simplified and the end-point can be more accurately determined.

In an example of the end-point detection system 200 of FIG. 2, the constant current power supply 210 can be a Keithley model 2400 power supply. The signal amplifier 220 that is AC coupled to the output of the power supply 210 can be a DL Instruments model 1201 amplifier. The FIB system 230 can include a FEI FIB200DE Focused Ion Beam System. The output of the signal amplifier 220 can be coupled to a stage current monitoring circuit of the FIB200DE FIB system 230.

The constant current power supply 210 can bias the device to be modified 100 with a bias current that results in a power supply voltage approximately equal to a nominal operating voltage of the device 100. The change in supply voltage due to a cycled FIB can be used as an indication that the FIB has reached a desired conductor. The FIB milling process can stop in response to a sufficient signal from the signal amplifier 220.

Figure 3:
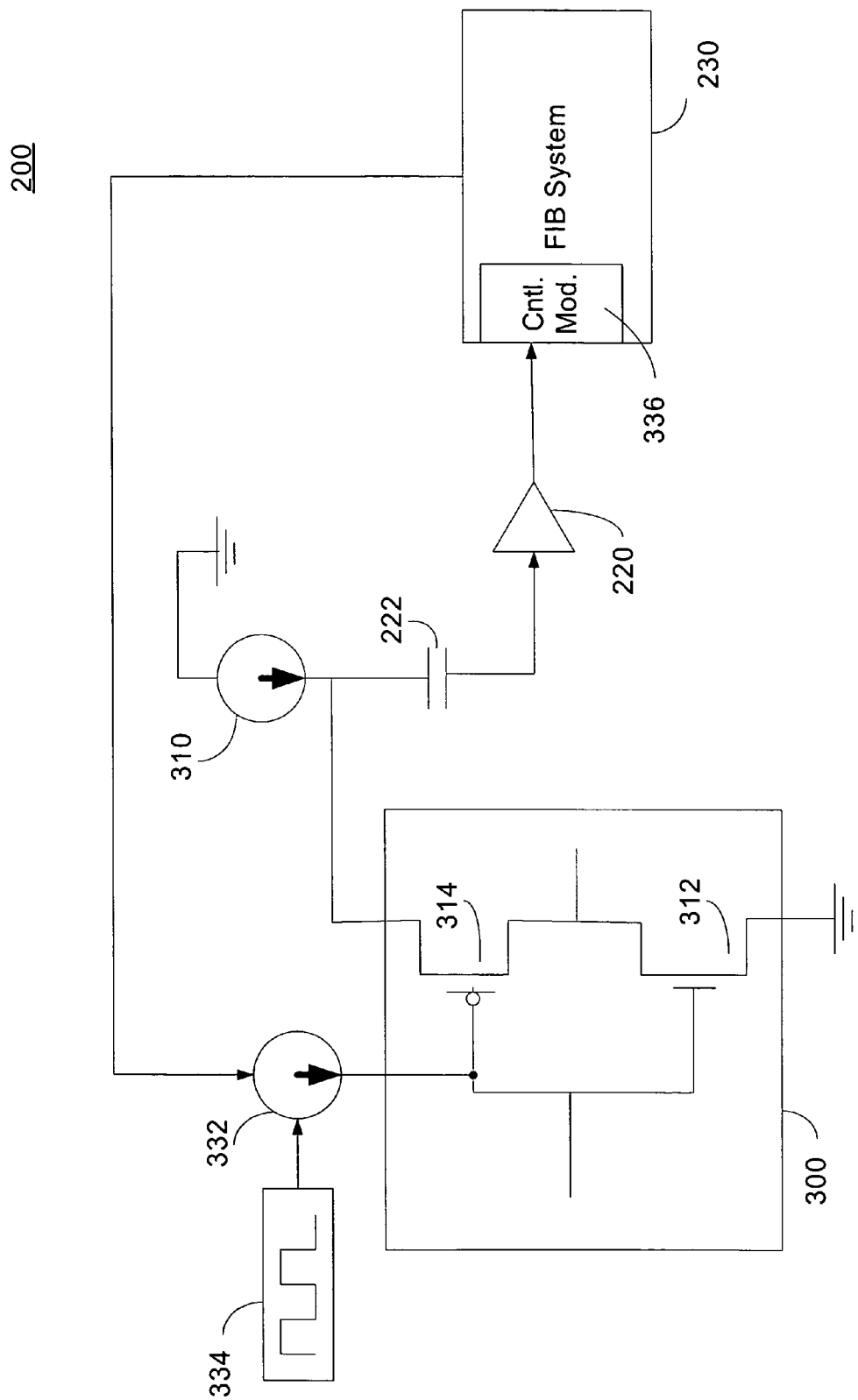
FIG. 3 is a functional block diagram of the end-point detection system showing a representative gate.

FIG. 3 is a functional block diagram of the end-point detection system 200 showing a representative gate in a device 300 that can be used as an amplifier. The system 200 of FIG. 3 can be the same as the system 200 shown in FIG. 2. Some of the components are shown as functional equivalents for the purposes of explanation.

The device can include a CMOS inverter that includes a p-channel FET 314 and a complementary n-channel FET 312. Other gates and circuits that may be a part of the device 300 are not shown for clarity. The device 300 is shown as a CMOS device for illustration purposes. The end-point detection system 200 is not limited to use with CMOS devices, but is applicable to any type of electrical device. For example, the device 300 may be a CMOS device or a bipolar device manufactured using any of a variety of technologies.

The current source 310 providing the bias current to the device 300 can be the constant current power supply 210 of FIG. 2. A capacitor 222 AC couples the output of the current source 310 to a signal amplifier 220. The output of the signal amplifier 220 is coupled to a control input of the FIB system 230. An output of the FIB system 230 is shown coupled to a current source 332 that represents the effect of the beam current on the device 300.

The input to the device 300 can be floating such that the inputs to the p-channel device 314 and the n-channel device 312 are floating. A floating input typically will drift to a steady state voltage value that can vary depending on the associated circuits and structures that are common to the input. The steady state floating input voltage is likely insufficient to bias on the n-channel device 312.

The constant current power supply 310 can energize the device 300 by providing a bias current to the input supply pins that is sufficient to bring the voltage at the input pins up to a predetermined nominal voltage value.

The signal amplifier 220 can monitor the AC component of the device 300 input voltage and will output a low signal once the device voltage settles to the steady state value. The FIB from the FIB system 230 can be positioned over the conductive trace that is to be uncovered. For this example, the conductive trace to be accessed is common to the input of the CMOS inverter implemented with the n-channel device 312 and the p-channel device 314.

Once energized, the FIB removes material from the device 300 over the conductive trace. The FIB is cycled to facilitate AC signal detection. For example, the beam current to the FIB may be cycled on and off. The cycled FIB may be modeled as a FIB current source 332 that is cycled. The FIB current source 332 may be unable to inject current onto the conductive trace until the material covering the conductive trace is removed.

The end-point that is to be detected can be the surface of the conductive trace. The FIB should continue to mill until at least the surface of the conductive trace is revealed to ensure that a low impedance connection can be made to the trace. Once the FIB reaches the conductive trace, the FIB milling process should cease in order to prevent damage to the conductor.

The FIB current source 332 injects charge onto the input of the CMOS inverter when the FIB reaches the conductive trace. The charge injected on the input of the CMOS inverter results in an increase in the voltage at the gates of the n-channel device 312 and the p-channel device 314. The current drawn by the CMOS inverter increases as the input voltage to the input of the CMOS inverter increases. The charge injected on the input of the inverter biases the n-channel device 312 on when the voltage exceeds the gate-source threshold voltage. The p-channel device 314 can conduct while its gate voltage is lower than the value needed to cutoff conduction. Thus, the inverter can conduct current as it would in a state transition once the FIB current source 332 begins to inject charge onto the inverter input. The voltage on the input of the CMOS device continues to increase as the FIB current source 332 pumps charge onto the conductive trace and eventually, the p-channel device 314 will be cutoff and no more current will conduct through the inverter. The input drifts back to the steady state condition when the FIB current source 332 ceases injecting charge onto the conductive trace.

Because the device 300 is biased with a constant current power supply 310, the increased current load due to the current path through the inverter results in a drop in the supply voltage. The voltage drop can be dramatic in the case of CMOS devices 300 because the transition current through the inverter can be orders of magnitude greater than the steady state current. The end-point detection system 200 effectively uses the device 300 as a transimpedance amplifier to amplify a signal from the FIB current source 332.

The sudden drop in the supply voltage can be coupled to the signal amplifier 220 through the capacitor 222. The signal amplifier 220 can then amplify the voltage change and provide the amplified output to the FIB system 230 to control or otherwise indicate to the FIB system 230 the FIB has reached the end-point.

A duty cycle controller 334 can be configured to control the FIB cycle. The duty cycle controller 334 can be internal to, and part of, the FIB system 230, external to the FIB system 230, or may have portions that are internal to the system and other portions that are external to the system. Cycling the FIB greatly facilitates end-point detection. The supply voltage to the device 300 can drop dramatically as the FIB current source 332 injects charge onto the conductive trace. The supply voltage to the device 300 transitions back to the steady state value when the FIB current source 332 ceases injecting charge. Cycling the FIB, such as by cycling the FIB current, can result in the supply voltage to the device 300 periodically dropping and recovering in synchronization with the FIB cycle.

In one embodiment, the period of FIB cycling can be varied to allow the FIB current source 332 to inject charge just as the device 300 supply voltage returns to approximately its steady state value. In another embodiment, the FIB period may be fixed and the FIB duty cycle may be varied to allow the device 300 steady state voltage to return to approximately its steady state value. In another embodiment, both the duty cycle and period may be variable. For example, the duty cycle can be nearly 100% during the initial period of FIB milling because there may be little probability that the conductive trace will be reached. The duty cycle may be varied over time as the probability of reaching the conductive trace increases. Varying the duty cycle can reduce the FIB milling time compared to milling with a fixed duty cycle. In still other embodiments, the response time of the FIB system 230 may be sufficient to allow both the duty cycle and period of the FIB cycle to be fixed.

The amplified AC signal output from the signal amplifier 220 can be coupled to a control input of the FIB system 230. The signal can be coupled to a control module 336 within the FIB system 230. The control module 336 is shown as internal to the FIB system 230, but may have portions or the entirety of the module internal or external to the FIB system 230. The control module 336 can process the amplified signal and control the FIB milling process. Additionally, the control module 336 can process the amplified signal and provide an indication of the status of the FIB milling process. For example, the control module 336 can include a rectifier that converts the amplified AC signal to a DC value. The output of the rectifier can be coupled to a comparator that compares the DC value to a predetermined threshold. The output of the comparator can be used to halt the FIB milling process.

Alternatively, or in addition to a control loop, the amplified signal or a processed version of the amplified signal can be used to drive a display, meter, or some other indicator to inform an operator to halt the FIB milling process. For example, the amplified signal can be coupled to a control module 336 that forms a part of the stage current monitoring circuit of the FIB system 230. The control module can generate an end-point monitor graph that is based at least in part on the signal from the signal amplifier 220. An operator can view the end-point monitor graph and halt the FIB milling process when a predetermined value is reached.

Figure 4:
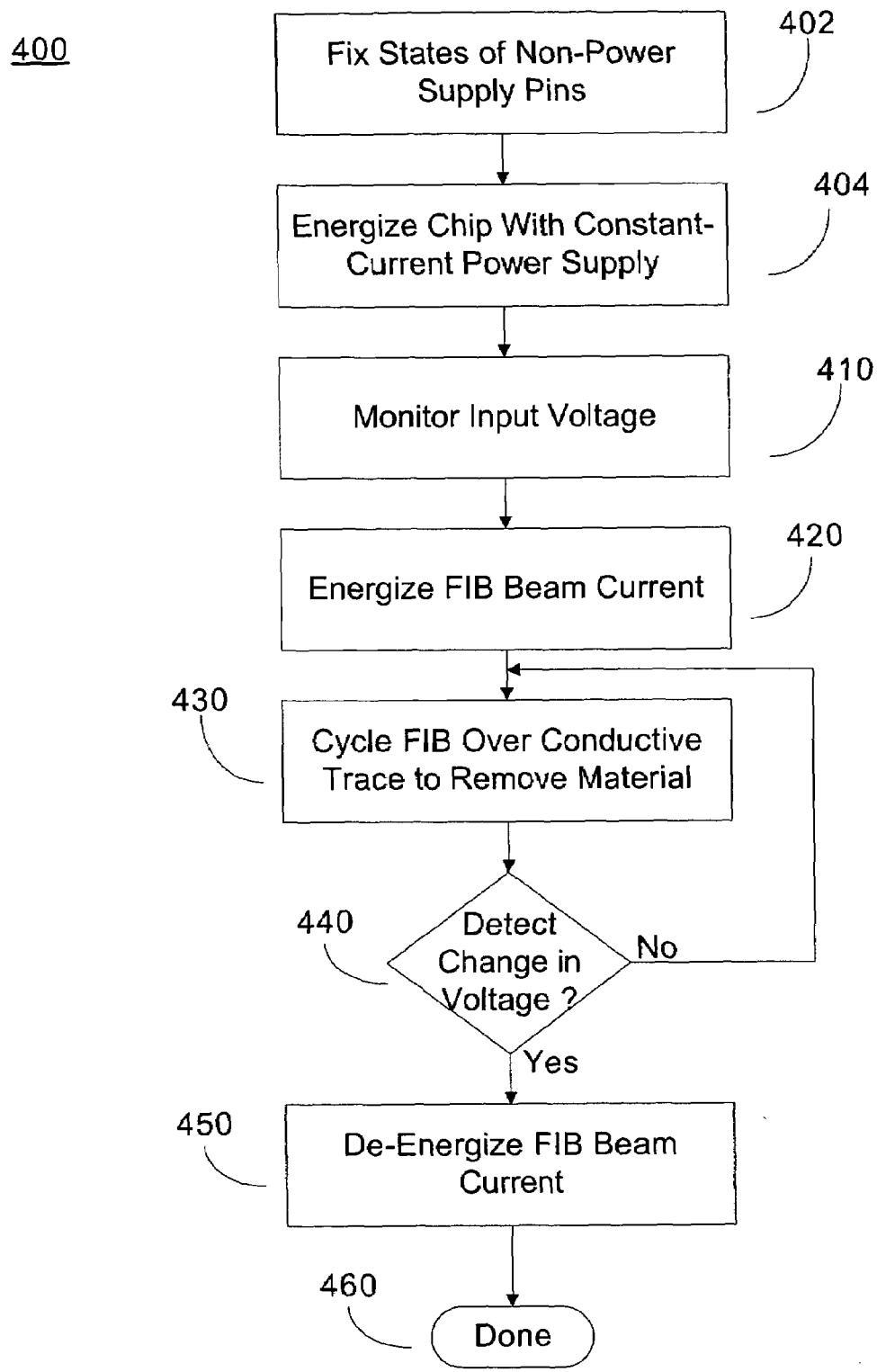
FIG. 4 is a flowchart of an end-point detection process.

FIG. 4 is a flowchart of an end-point detection process 400 that may be performed, for example, by the end-point detection system shown in FIG. 2 or FIG. 3. Although the flowchart illustrates the various steps of the process 400 as occurring in a predetermined order, the order of steps may not be required. Some of the steps of the process may be performed in a different order. Also, additional steps or sub-processes may be inserted between steps, or some steps may be omitted from the process 400.

The process 400 begins at block 402 where the device non-power pins are configured, or fixed to desired states. For example, the end-point detection system may include a test fixture into which a device to be modified is inserted. The test fixture can include the desired pull-up and pull-down circuits, open circuits, or connections that place the pins of the device to be modified within the desired states when the device is energized.

After fixing the states of the non-power supply pins to the desired states, the end-point detection system proceeds to block 404 where the device, or chip, is energized using a constant current power supply. As discussed earlier, the constant current power supply may bias the device with a current that results in a power supply voltage that is approximately the nominal power supply voltage.

For example, in an automated process, a constant current power supply can supply the bias current and monitor the power supply voltage. The constant current power supply can continue to increase the current output until the power supply voltage meets or exceeds a predetermined operating voltage. Alternatively, an operator can increase the bias current of a constant current power supply and can monitor the supply voltage. The operator can maintain the bias current once the power supply voltage reaches the desired operating voltage.

After biasing the device with the constant current source, the end-point detection system proceeds to block 410 to monitor the device input voltage or some other device value. For example, the end-point detection system can monitor device power or device current in addition to, or exclusive of, the input voltage.

Once device monitoring is enabled, the end-point detection system can proceed to block 420 where the FIB is positioned over the desired conductive trace and the FIB is energized. For example, the FIB beam current can be energized.

After energizing the FIB, the end-point detection system proceeds to block 430 and can cycle the FIB over the conductive trace to remove material. As described earlier, the FIB can be cycled to facilitate end-point detection. The FIB may be cycled using electronic cycling, physical cycling, or a combination of electronic and physical cycling.

The end-point detection system then proceeds to decision block 440. In decision block 440, the end-point detection system determines if there is a change in the device input voltage. If the end-point detection system does not detect any change in the supply voltage or if the change in voltage is less than a predetermined threshold, the end-point detection system returns to block 430 and continues to remove device material.

Returning to decision block 440, if the end-point detection system detects a change in voltage that is greater than or equal to a predetermined threshold, it is probable that the FIB has reached the conductive trace. Thus, the end-point detection system detects the milling end-point when the current injected by the FIB results in a change in voltage that is greater than a predetermined threshold voltage. The end-point detection system proceeds to block 450.

In block 450, the end-point detection system halts the milling process, for example, by de-energizing the beam current for the FIB. Once the FIB is de-energized the milling process is stopped. The end-point detection system proceeds to block 460 and the process 400 is done.

Figure 5B:
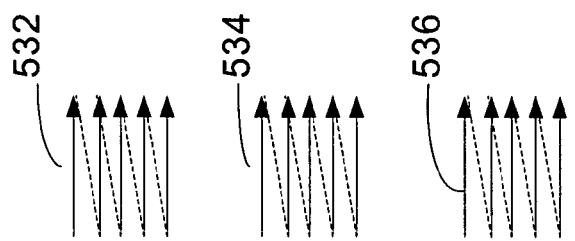
FIGS. 5A–5B are diagrams of FIB scanning patterns.
Figure 5B:
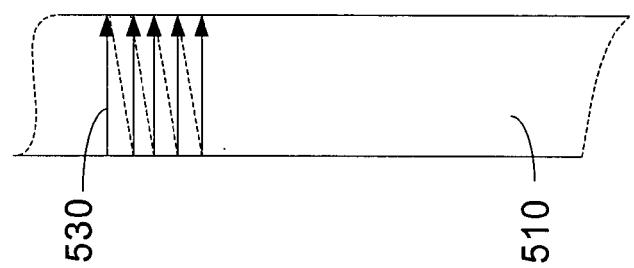
Figure 5A:
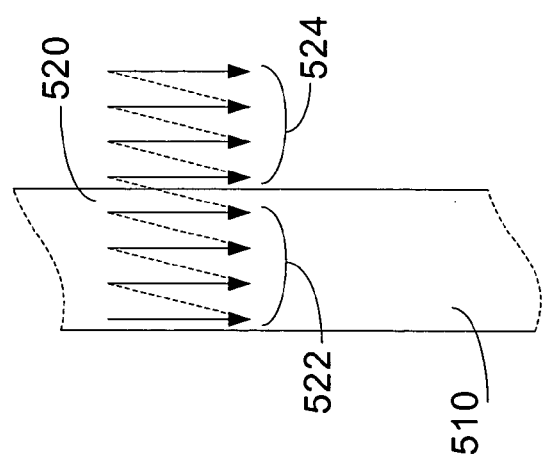

FIGS. 5A–5B are diagrams of FIB scanning patterns that can be used to implement physical cycling of the FIB. FIG. 5A shows a diagram of a FIB scanning pattern 520 where the FIB beam scans over a conductive trace 510 for a portion of the pattern. The scanning pattern 520 includes a number of FIB scans that are arranged as a raster scan pattern. A first portion 522 of the scans of the raster scan can extend within the boundaries of the conductive trace 510. A second portion 524 of the raster scans can extend outside the boundary of the conductive trace 510. Thus, during the period of time for the first portion 522 of scans, the FIB is energized relative to the conductive trace 510. During the period of time for the second portion 524 of scans, the FIB is de-energized relative to the conductive trace 510. Thus, the physical scanning pattern 520 effectively cycles the FIB over the conductive trace 510.

FIG. 5B shows a second physical cycling embodiment where the aggregate scan pattern includes multiple scan patterns 530, 532, 534, and 536. Each of the multiple scan patterns 530, 532, 534, and 536 includes multiple FIB scans arranged in a raster scan pattern. A first raster scan pattern 530 is configured to scan substantially within the borders of a conductive trace 510. The second through fourth raster scan patterns 532, 534, and 536 can be configured to be substantially outside the borders of the conductive trace 510.

Thus, the FIB can be physically cycled by multiplexing over the multiple scan patterns 530, 532, 534, and 536. For example, the FIB can be cycled with a 50% duty cycle by alternating the first raster scan pattern 530 with each of the second through fourth raster scan patterns 532–536. The amount of material removed within each of the second through fourth raster scan patterns 532, 534, and 536 will then be approximately one third the material removed within the first raster scan pattern 530. In this manner, the FIB can be physically cycled without requiring additional areas to be milled down to the depth of the conductive trace 510.

Although the scan patterns are shown in the figures as raster scan patterns, the scan patterns may be any pattern, including a stationary beam, a serpentine pattern, a circular pattern, a random pattern, and the like. The pattern may be generated by a scan controller within the FIB system or may be generated by a module external to the FIB system. Moreover, scanning the beam over the device includes manipulating the device beneath a stationary beam, or manipulating a device while repositioning the beam.

An end-point detection system has been disclosed that allows location of a conductive trace within a device when machining the device with a FIB. The device is used as an amplifier to amplify the FIB current into a signal that can be used to halt the milling process. The device is energized or biased with a constant current power supply. When the FIB reaches the desired conductive trace, the FIB injects charge, or current, onto the trace. The injected current can be amplified by structures within the device, such as through a state change of a gate or circuit. The amplification of the FIB current can, in turn, cause the supply voltage of the constant current power supply to change in response to the change in the current drawn by the device. The voltage may increase or decrease in response to a current change. A signal amplifier can amplify the change in voltage and the amplified signal can be used to halt the FIB milling process.

Those skilled in the art will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons may implement the described functionality in varying ways for each particular application, but such implementation decisions should not be interpreted as causing a departure from the scope of the disclosure.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. A software module may reside in RAM memory, flash memory, non-volatile memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor.

The above description of the disclosed embodiments is provided to enable any person skilled in the art to make or use the disclosure. Various modifications to these embodiments will be readily apparent to those skilled in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of detecting an end-point using a Focused Ion Beam (FIB), the method comprising:
   energizing a device with a constant current power supply;
   removing material from the device over at least a portion of a conductor using the FIB, wherein the FIB is a physically cycled FIB;
   monitoring a supply voltage of the device; and
   determining the end-point is reached based in part on the supply voltage.

2. The method of claim 1, further comprising halting material removal after determining the end-point is reached.

3. The method of claim 1, further comprising de-energizing the FIB after determining the end-point is reached.

4. The method of claim 3, wherein de-energizing the FIB comprises reducing a beam current of the FIB.

5. The method of claim 1, wherein monitoring the supply voltage comprises monitoring an AC component of the supply voltage.

6. The method of claim 1, wherein monitoring the supply voltage comprises:
 amplifying an AC component of the supply voltage to generate an amplified signal; and
 determining a magnitude of the amplified signal.

7. The method of claim 6, wherein determining the end-point is reached comprises determining the magnitude of the amplified signal exceeds a predetermined threshold.

8. The method of claim 1, wherein energizing the device with the constant current power supply comprises applying a bias current to the device until the supply voltage is approximately a nominal operating voltage.

9. The method of claim 1, wherein energizing the device with the constant current power supply comprises applying a bias current to the device until the supply voltage is within a predetermined percentage of a nominal operating voltage.

10. The method of claim 1, wherein energizing the device with the constant current power supply comprises applying a predetermined bias current to the device.

11. The method of claim 1, wherein the device comprises an Application Specific Integrated Circuit (ASIC).

12. The method of claim 1, wherein the device comprises a CMOS integrated circuit.

13. The method of claim 1, wherein the device comprises an analog device.

14. The method of claim 1, wherein the conductor comprises a metal trace.

15. The method of claim 1, wherein the conductor comprises a polysilicon trace.

16. A method of detecting an end-point using a Focused Ion Beam (FIB), the method comprising
 energizing a device with a constant current power supply until a power supply voltage is within a predetermined percentage of a nominal operating voltage;
 milling a portion of the device that overlaps at least a portion of a conductive trace using a physically cycled FIB;
 monitoring an AC component of the power supply voltage;
 determining the end-point is reached when the AC component is greater than or equal to a predetermined value; and
 halting milling after determining the end-point is reached.

17. A method of detecting an end-point using a Focused Ion Beam (FIB), the method comprising:
 milling a device with the FIB to remove material over at least a portion of a conductive trace, wherein the FIB comprises a physically cycled FIB;
 injecting current onto the conductive trace with the FIB;
 amplifying the current with the device to produce an end-point detection signal; and
 determining the end-point is reached when the end-point detection signal exceeds a predetermined threshold.

18. The method of claim 17, wherein amplifying the current comprises transimpedance amplifying the current to produce a voltage.

19. A method of detecting an end-point using a Focused Ion Beam (FIB), the method comprising:
 injecting a current onto a conductive trace within a device with a physically cycled FIB;
 amplifying the current using an electric circuit within the device to produce an amplified signal; and
 determining the end-point is reached based at least in part on the amplified signal.

20. A method of detecting an end-point using a Focused Ion Beam (FIB), the method comprising:
 configuring a state of non-power supply pins in a device to be modified;
 energizing the device with a constant current power supply;
 monitoring a device input voltage;
 energizing the FIB;
 physically cycling the FIB to remove material over at least a portion of a conductive trace within the device; and
 de-energizing the FIB when the device input voltage changes be a predetermined amount.

21. An end-point detection system, the system comprising:
 a Focused Ion Beam (FIB) configured to remove material from a device over a portion of a conductive trace by physically cycling a beam over said portion;
 a constant current power supply configured to provide a bias current to the device;
 an amplifier configured to amplify at least a component of a device power supply voltage to produce an amplified signal; and
 a control module configured to process the amplified signal and provide an indication of an FIB position, the control module configured to indicate the end-point is reached based in part on the amplified signal.

22. The system of claim 21, wherein the FIB is further configured to halt material removal after the control module indicates the end-point is reached.

23. The system of claim 21, wherein the conductive trace comprises a metal layer.

24. The system of claim 21, wherein the amplifier is configured to amplify an AC component of the device power supply voltage.

25. The system of claim 21, wherein the indication of the FIB position comprises an end-point indicator.

26. An end-point detection system, the system comprising:
 means for energizing a device;
 means for removing material from the device over at least a portion of a conductor within the device using a physically cycled Focused Ion Beam (FIB);
 means for monitoring a supply voltage of the device; and
 means for determining the end-point is reached based in part on the supply voltage.

* * * * *